United States Patent [19]

Schaffer et al.

[11] Patent Number: 5,538,796
[45] Date of Patent: Jul. 23, 1996

[54] THERMAL BARRIER COATING SYSTEM HAVING NO BOND COAT

[75] Inventors: Jon C. Schaffer, Milford; Wendy H. Murphy; William B. Connor, both of Cincinnati; Bangalore A. Nagaraj, West Chester, all of Ohio; Himanshu B. Vakil, Schenectady, N.Y.

[73] Assignee: General Electric Company, Cincinnati, Ohio

[21] Appl. No.: 960,494

[22] Filed: Oct. 13, 1992

[51] Int. Cl.$^6$ ........................................ B32B 15/04
[52] U.S. Cl. ...................... 428/469; 148/675; 427/585; 427/532; 416/241 B
[58] Field of Search ...................... 427/584, 585, 427/532; 428/469, 680, 938; 148/675; 416/241 B

[56] References Cited

U.S. PATENT DOCUMENTS

| | | | |
|---|---|---|---|
| 3,544,348 | 12/1970 | Boone et al. | 117/2 |
| 3,581,491 | 6/1971 | Bornstein et al. | 60/39.02 |
| 3,853,540 | 12/1974 | Schlatter et al. | 74/53 |
| 3,928,026 | 12/1975 | Iecht et al. | 75/134 F |
| 4,142,023 | 2/1979 | Bornstein et al. | 428/680 |
| 4,152,223 | 5/1979 | Wallace et al. | 204/37 R |
| 4,530,720 | 7/1985 | Moroishi et al. | 75/128 A |
| 4,626,408 | 12/1986 | Osozawa et al. | 420/442 |
| 4,895,201 | 1/1990 | DeCrescente et al. | 164/56.1 |
| 5,034,284 | 7/1991 | Bornstein et al. | 428/680 |
| 5,262,245 | 11/1993 | Ulion et al. | 428/469 |
| 5,346,563 | 9/1994 | Allen et al. | 148/675 |

OTHER PUBLICATIONS

"Scale Adherence Effects in Oxidation and Sulfidation"—M. A. DeCrescencte and N. S. Bornstein—NASA Report NAS 23-27, Nov. 1990.

"The Effect of Indigenous Sulfur on the High Temperature Oxidation Performance of the Chromia–forming Alloy Ni–40 Wt. % Cr"—J. G. Smeggil, *The Minerals, Metals & Materials Society*, 1989.

"The Effect of Sulfur Removal on $Al_2O_3$ Scale Adhesion"—James L. Smialek, *The Minerals, Metals & Materials Society*, 1989.

"Effect of Sulfur Removal on Scale Adhesion"—B. K. Tubbs and J. L. Smialek, *The Minerals, Metals & Materials Society*, 1989.

"Study to Demonstrate Superior Oxidation Resistance of Aluminide Coatings"—N. S. Bornstein, Report R90–917552–1 (Final Report to Naval Air Development Center 1989).

*Primary Examiner*—Donald P. Walsh
*Assistant Examiner*—Daniel Jenkins
*Attorney, Agent, or Firm*—Andrew C. Hess; David L. Narciso

[57] ABSTRACT

A coated article is prepared by melting and casting an article substrate formed of a nickel-base superalloy. The article substrate is heated in a hydrogen-containing atmosphere at a temperature of at least 2000° F. for a period sufficient to desulfurize the substrate to a sulfur content of less than about 1 part per million. Optionally, an aluminum-oxide environmental coating is provided overlying the substrate. A ceramic thermal barrier coating is applied overlying the substrate. Significantly, there being no bond coat applied to the substrate prior to the application of the thermal barrier coating.

24 Claims, 7 Drawing Sheets

THERMAL BARRIER COATING SYSTEM HAVING NO BOND COAT

BACKGROUND OF THE INVENTION

This invention relates to thermal barrier coating systems for protecting substrates from high external temperatures, and, more particularly, to such a system wherein a bond coat is not required.

In an aircraft gas turbine (jet) engine, air is drawn into the front of the engine, compressed by a shaft-mounted compressor, and mixed with fuel. The mixture is burned, and the hot exhaust gases are passed through a turbine mounted on the same shaft. The flow of gas turns the turbine, which turns the shaft and provides power to the compressor. The hot exhaust gases flow from the back of the engine, driving it and the aircraft forward.

The hotter the exhaust gases, the more efficient is the operation of the jet engine. There is thus an incentive to raise the exhaust combustion gas temperature. However, the maximum temperature of the combustion gases is normally limited by the materials used to fabricate the turbine vanes and turbine blades of the turbine, upon which the combustion gases impinge when they are at their hottest temperatures. In current engines, the turbine vanes and blades are made of nickel-base superalloys, and can operate at metal temperatures of up to about 2100° F.

Many approaches have been used to increase the operating temperature limit of the turbine blades and vanes. The composition and processing of the materials themselves have been improved. Physical cooling techniques are used. In one approach, internal cooling channels are provided within the components, and cool air is forced through the channels during engine operation. In another approach, a thermal barrier coating system is applied to the turbine blade or turbine vane component, which acts as a substrate. The thermal barrier coating system typically includes a ceramic thermal barrier coating material that insulates the component from the hot exhaust gas, permitting the exhaust gas to be hotter than would otherwise be possible with the particular material and fabrication process of the component, or, alternatively, reducing the amount of cooling air that is required to cool the metallic substrate portion of a coated component. These two approaches, cooling air forced through internal cooling channels and thermal barrier coating systems, have also been combined to allow the operating temperatures to be further increased.

It has been disclosed that aluminide coating life can be improved by reducing sulfur in the substrate prior to the application of the aluminide coating. See Final Report to Navla Air Deyelopment Center R90-917552-1. The aluminide coating is less tolerant of sulfur than a superalloy substrate. It has also been reported by Smialek, "The Effect of Sulfur Removal on $Al_2O_3$ Scale Adhesion" The Mineral, Metals and Materials Society, 1989, that reducing sulfur in the substrate also improves the adhesion of aluminum oxide scale in NiCrAl alloys, but has marginal effect in improving adhesion of aluminum oxide scale in NiCrAlY alloys because yttrium acts to eliminate the negative effect of sulfur.

Typical thermal barrier coating systems employ ceramic materials which usually do not adhere well directly to the superalloys used in the substrates. Therefore, an additional metallic layer called a bond coat is placed between the substrate and the thermal barrier coating. Bond coats typically are aluminides or MCrAlY's, where M includes nickel.

The bond coat composition is selected to adhere to the underlying substrate, to adhere well to the overlying thermal barrier coating, and also to reduce the tendency of the substrate to degrade from oxidation and corrosion. The bond coat resists the oxidizing effects of the hot combustion gas stress in a gas turbine engine, but other elements present in the coating contribute to the ability of the ceramic coating to adhere to the substrate material, as noted in Strandman et al., U.S. Pat. No. 4,880,614. Commonly used bond coat materials include MCrAlY alloys, where M is an element selected form the group consisting of Ni, Co and combinations thereof, and aluminides such as the platinum aluminides (PtAl).

Structures such as thermal barrier coating systems and internal cooling passages permit hot-section gas turbine components to be used at higher temperatures than otherwise possible. However, at the same time steps must be taken to ensure that the components do not degrade from oxidation, hot corrosion, and other effects in the hostile environment of the high-temperature, high-velocity combustion gas. In one approach to improving environmental resistance, the composition of the substrate is modified. For example, yttrium, zirconium and/or rare earth elements are sometimes added to the substrate alloy in small amounts, and these additions have been shown to improve resistance to high-temperature oxidation and corrosion, thereby extending the life of the substrate. Although the mechanism is not fully understood, these additions are particularly beneficial in improving the adhesion of the oxide scales which form on the substrate, acting to protect it.

In another approach, an environmentally resistant coating may be deposited over the substrate as part of a thermal barrier coating systems to protect the substrate against oxidation and hot corrosion damage. The environmentally resistant coating is typically an aluminum-rich alloy whose surface oxidizes to form an aluminum oxide at elevated temperature. The aluminum oxide is present as an adherent scale that acts as a diffusion barrier against diffusion into the substrate of such detrimental substances as oxygen, sulfur, nitrogen, and other potential damaging components of the combustion gas.

These differing approaches to achieving long operating lives at high temperatures are often used in combination, leading to the best results currently obtained with metallic gas turbine blades and vanes. However, as the design and metallurgical techniques have become more sophisticated, in some instances they have also become quite expensive. The many steps required for the application of thermal barrier coating systems raises the price of the coated components. The substrates themselves have also become more costly to melt and cast. For example, when they are used even in relatively small amounts, the presence of additions such as yttrium, zirconium and/or rare earth elements requires that special ceramics be used in the casting process. Also, the more complex the structures and manufacturing processes, the more potential failure modes and possibilities for manufacturing errors.

There is an ongoing need for improved superalloy articles, and methods for their preparation, which attain long operating lives at elevated temperatures, but also have better producibility, lower cost, and less complex structures. The present invention fulfills this need, and further provides related advantages.

SUMMARY OF THE INVENTION

The advantages of the present invention include depletion of sulfur (S) from the substrate surface while maintaining an effective level of aluminum in the substrate to promote the formation of a protective scale of aluminum oxide ($Al_2O_3$).

Another advantage of the present invention is the formation of an aluminum oxide coating directly over the substrate and eliminates the need for conventional high aluminum-containing environmental coatings such as PtAl for substrate protection.

Still another advantage of the present invention is that because the aluminum oxide scale is not iteratively spalled and reformed, the aluminum content of the substrate is not depleted and the strength of the substrate is retained over its useful life since the substrate strengthening phase, gamma prime ($Ni_3Al$), does not lose as much aluminum due to aluminum migration, driven by chemical potential, to the surface to form aluminum oxide.

The present invention provides a manufacturing method for the preparation of a coated component for use at elevated temperatures, and a component made by the method. The resulting components are operable at high temperatures because of the presence of an adherent thermal barrier coating, and have excellent resistance to spallation loss of the thermal barrier coating during repeated heating and cooling engine cycles. The components are also resistant to degradation by environmental attack. These advantages are obtained even though the bond coat has been specifically omitted. Removing the bond coat reduces the cost of the component. It also avoids the need for the bond coat layer that bears less of the structural loading than does the base metal substrate, thereby permitting the blades and vanes to be reduced in weight. Small weight reductions in these components can have significant effects on the overall engine weight, through reductions in the supporting structure. Finally, the invention permits the yttrium/rare earth content of the substrate to be reduced or eliminated, thereby making manufacturing less complex and expensive, and achieving good adherence of the thermal barrier coating to the substrate.

In accordance with the invention, a method for preparing a coated article comprises the steps of furnishing an aluminum-containing superalloy article substrate, thereafter desulfurizing the article substrate, and then applying a ceramic thermal barrier coating overlying the substrate by a physical vapor deposition (PVD) process without the application of an intermediate bond coat. The desulfurization is preferably accomplished by the known process of heating the article substrate to an elevated temperature in the presence of a gaseous reactive agent, such as hydrogen, that reacts with sulfur to form a gaseous sulfide. Significantly, no bond coat is applied to the substrate prior to the application of the thermal barrier coating.

It has now been discovered that a low sulfur content of the substrate, preferably 1 part per million (ppm) and below about 1 part per million, is important in achieving good adhesion of the PVD-applied ceramic thermal barrier coating directly to the substrate, without the need for an intermediate bond coat. A low sulfur content, as used herein includes critical sulfur concentrations at or below which the adhesion behavior of $Al_2O_3$ on the surface of the substrate is not adversely affected, that is, the $Al_2O_3$ scale does not spall from the substrate surface. Although the aim is for about 1 ppm or less, the critical concentration may be as high as 3 ppm. The critical concentration will vary, with higher amounts being acceptable for parts exposed to lower temperatures, or exposed to high temperatures for shorter periods of time. By reducing the sulfur content of the substrate to such a low sulfur content, the aluminum oxide that naturally forms on the surface of an aluminum-containing superalloy substrate is quite adherent and protective of the substrate. It has been found that substrate articles having high sulfur content and no intermediate coat, such as a bond coat, tend to have spallation of directly-applied ceramic top coats. Up until now, this spallation has been impeded by the use of an intermediate coat such as a bond coat, for example as reported in U.S. Pat. No. 4,880,614. The present invention, however, impedes the spallation of ceramic top coats without the need for an intermediate coat between the substrate and the ceramic top coat, by reduction of the sulfur content in the substrate article, thus allowing for the application of a ceramic top coat by a PVD process directly to a substrate article for use at high temperature without spallation of the top coat. An aluminum-rich environmentally protective overcoating, either aluminum oxide or a material such as an aluminide whose surface oxidizes to) an aluminum oxide layer, can optionally be applied for further protection. However, because of the natural formation and increased adhesion of an aluminum oxide film at the substrate surface, an operation specifically for the purpose of applying an aluminum-rich layer of an alumina-forming layer is not required.

In any event, the thermal barrier coating has sufficiently good adherence to the substrate that the intermediate bond coat layer can be omitted.

Thus, more generally stated, a method for preparing a coated article comprises the steps of furnishing an article substrate formed of an aluminum-bearing nickel-base superalloy, the superalloy having a low sulfur content, the sulfur content being 3 ppm or less, and preferably 1 ppm or less, and applying a ceramic thermal barrier coating overlying the substrate, there being no additional intervening coat, bond coat or other type of coat, applied to the substrate prior to the application of the thermal barrier coating. This statement of the invention is to be interpreted to mean that the substrate to which the thermal barrier coating is applied must have such a low sulfur content. The ceramic thermal barrier coating is then applied directly to the substrate by a PVD process, such as electron beam deposition or by sputtering.

In the context of the present discussion the requirement for low sulfur content in the substrate is taken to mean that the sulfur content at the surface must be low, about 3 ppm and preferably about 1 ppm or below, and that the sulfur content of the substrate beneath the surface of the substrate must be low for a sufficient depth so that adherence of a thermal barrier coating during service life of a coated article is not adversely affected by diffusion of sulfur from well below the substrate surface to the interface between substrate and thermal barrier coating. For the purposes of this invention, the substrate is defined to include the $Al_2O_3$ surface scale and the underlying nickel-base superalloy. The interface between the substrate and the ceramic thermal barrier coating thus is the location where the $Al_2O_3$ surface scale and the ceramic top coat meet.

A master superalloy ingot may have a sulfur content of about 10 to 20 ppm. After metal from such a master heat has been melted and directionally solidified, the sulfur content may have risen to 100–8000 ppm of sulfur at the surface. In the course of research culminating in the present invention, such high sulfur contents were observed in directionally solidified castings made by commercial processes that are well known in the art. However, only 0.002 to 0.003 inches (0.05–0.076 mm) below the surface of the casting, the sulfur contents were found to be 10 to 20 ppm, just as in the master ingot. This research suggested that the large amount of sulfur at the surface may have been caused by the directional solidification process, but other processing steps prior to the application of a thermal barrier coating might also contribute to the sulfur content. Thus, in the present approach, it is preferred to conduct a long-term, high-temperature, solid-state diffusional desulfurization in a reducing gas such as hydrogen, immediately prior to the deposition of the thermal barrier coating. The object of the desulfurization is to reduce the sulfur content at least in the surface region of the substrate. The functionally defined depth of the surface region is that it must be sufficiently deep so that sulfur beneath such a surface region cannot diffuse to the surface in sufficient quantity to accelerate the spallation of the thermal barrier coating during service. For a thin wall substrate article, the functional depth of the surface region may extend through the entire thickness of the article. The desulfurization is preferably conducted at a temperature of at least 2200° F., and for an extended time that increases with the wall thickness of the component.

The present invention therefore provides an important advance in the art of coated components. Other features and advantages of the invention will be apparent from the following more detailed description of the preferred embodiments, taken in conjunction with the accompanying drawings, which illustrate, by way of example, the principles of the invention.

DETAILED DESCRIPTION OF THE PREFERRED EMBODIMENTS

Figure 1:
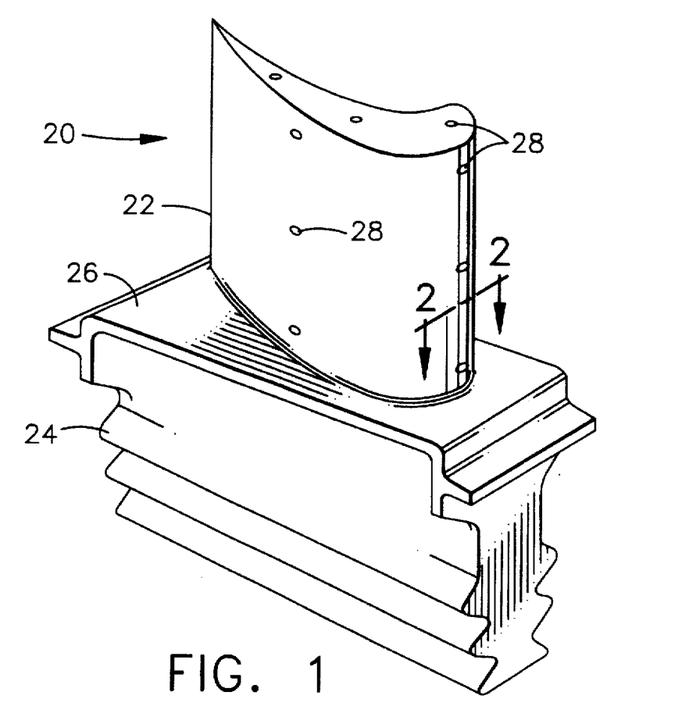
FIG. 1 is a perspective view of a gas turbine component.

FIG. 1 depicts a component of a gas turbine engine such as a turbine blade or turbine vane, and in this case is depicted as a turbine blade 20. The turbine blade 20 includes an airfoil portion 22 against which the flow of hot exhaust gas is directed. The turbine blade 20 is mounted to a turbine disk (not shown) by a dovetail portion 24 which extends downwardly from the airfoil portion 22 and engages a slot on the turbine disk. A platform 26 extends longitudinally outwardly from the area where the airfoil portion 22 is joined to the dovetail portion 24. A number of cooling channels desirably extend through the interior of the airfoil portion 22, ending in openings 28 in the surface of the airfoil portion 22. A flow of cooling air is directed through the cooling channels, to reduce the temperature of the airfoil portion 22.

Figure 2:
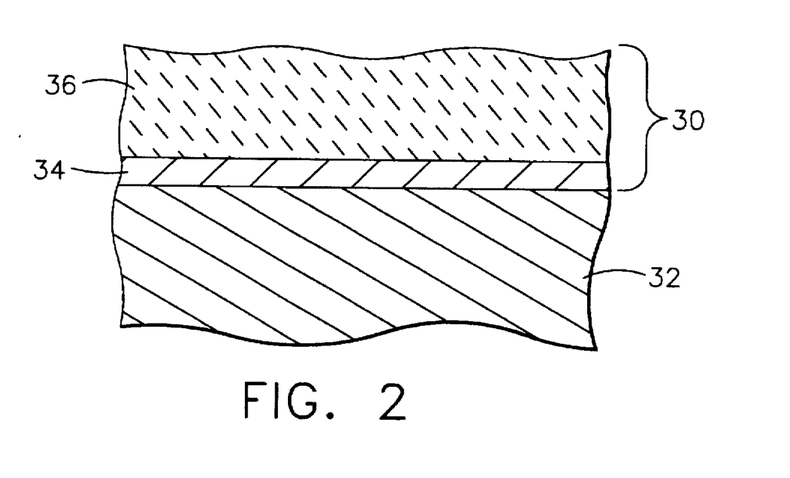
FIG. 2 is a sectional view through the component of FIG. 1, taken generally along line 2—2, illustrating a thermal barrier coating system on the surface of the component.

FIG. 2 illustrates a thermal barrier coating system 30 deposited upon the turbine blade 20 which thereby acts as a substrate 32. It is believed that the present invention is applicable to a substrate 32 formed of any aluminum-containing nickel-base superalloy that contains insufficient yttrium, zirconium or rare earth elements to tie up all of the sulfur in the form of stable sulfides. One applicable substrate alloy, known as Rene'N5, has a nominal composition, in weight percent, of 7.5% Co, 6.2% Al, 7% Cr, 6.5% Ta, 5% W, 1.5% Mo, 3% Re, 0.15% Hf, 0.05% C, the balance being Ni and incidental impurities (among which sulfur is included.). Although incidental impurities are usually defined to mean minor amounts of impurities and incidental elements which do not detrimentally affect the basic characteristics of the alloy, the discovery leading to this invention indicates that even small amounts of sulfur, i.e. as low as 1 ppm for certain applications, can detrimentally affect the basic characteristics of a hot section turbine component substrate when coated with a ceramic thermal barrier coat having no application of an intermediate coat such as a bond coat. The substrate 32 of the present invention preferably has a sulfur content of 1 part per million or less. Larger amounts of sulfur may interfere with the adherence of ceramic coatings to the surface of the substrate. Thus, the substrate is preferably treated to reduce the sulfur content of the substrate alloy, at least at its surface. The importance of treating the substrate so that sulfur is removed or otherwise neutralized can best be understood by reference to FIGS. 3 and 4, which depict the sulfur content at the surface of parts, cast turbine blades, and at various depths below the substrate surface. As can be seen, the sulfur content is highest at the surface of the part and decreases with increasing distance from the part surface.

Figure 3:
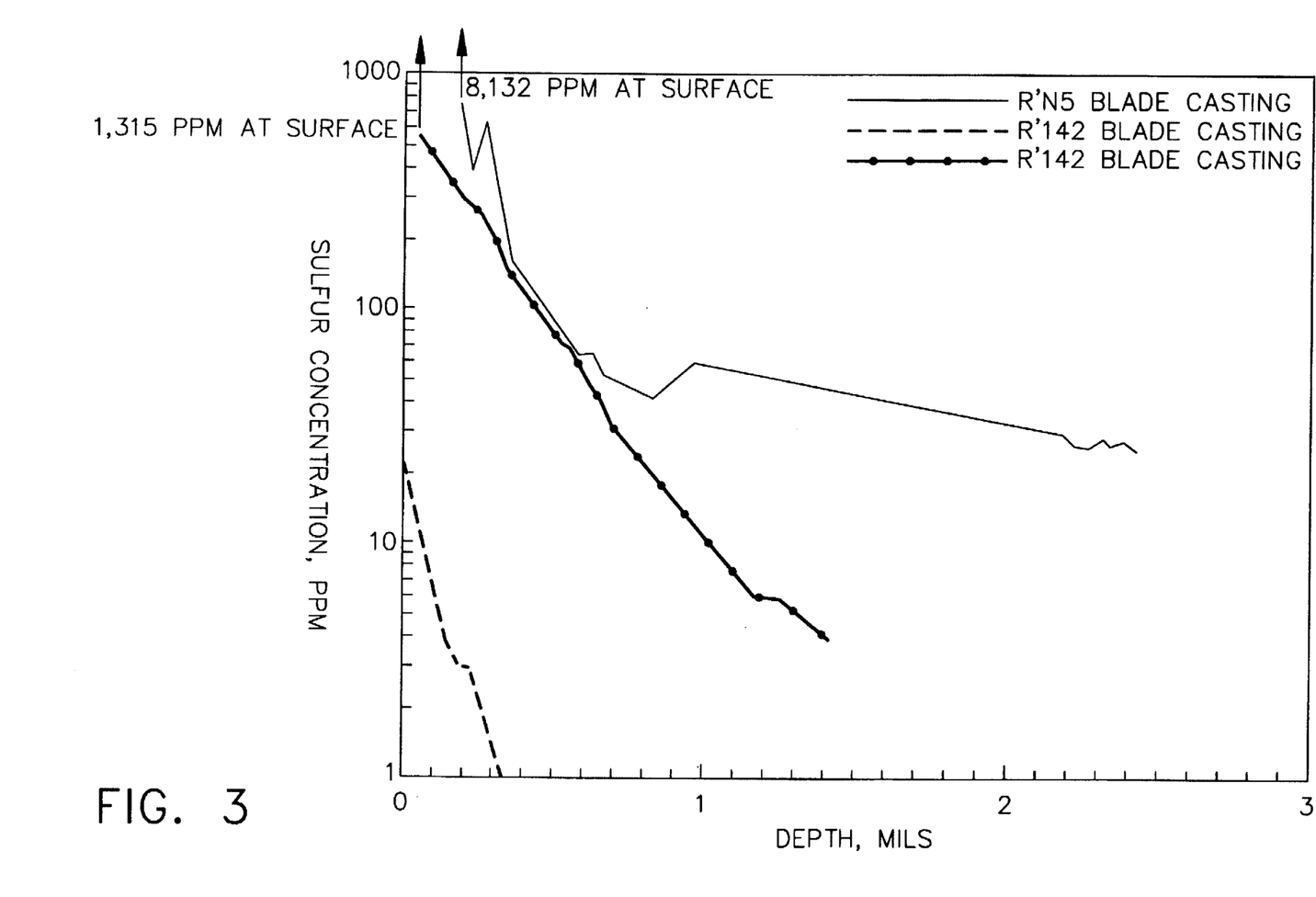
FIG. 3 is a graph showing the sulfur concentration versus depth, from the surface inward for the external side of a cast turbine blade.
Figure 4:
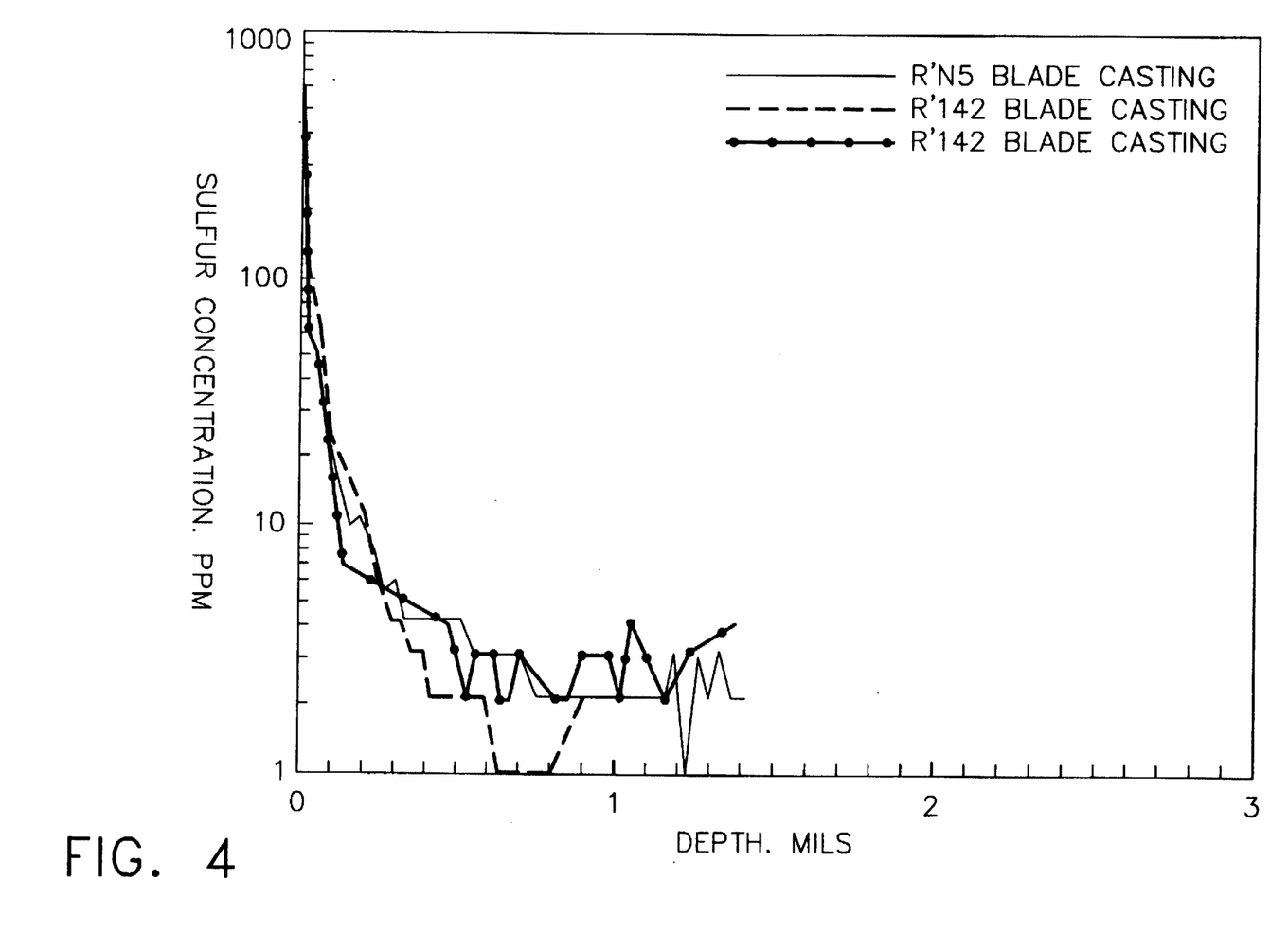
FIG. 4 is a graph showing the sulfur concentration versus depth, from the surface inward for the internal side of a cast turbine blade.
Figure 5:
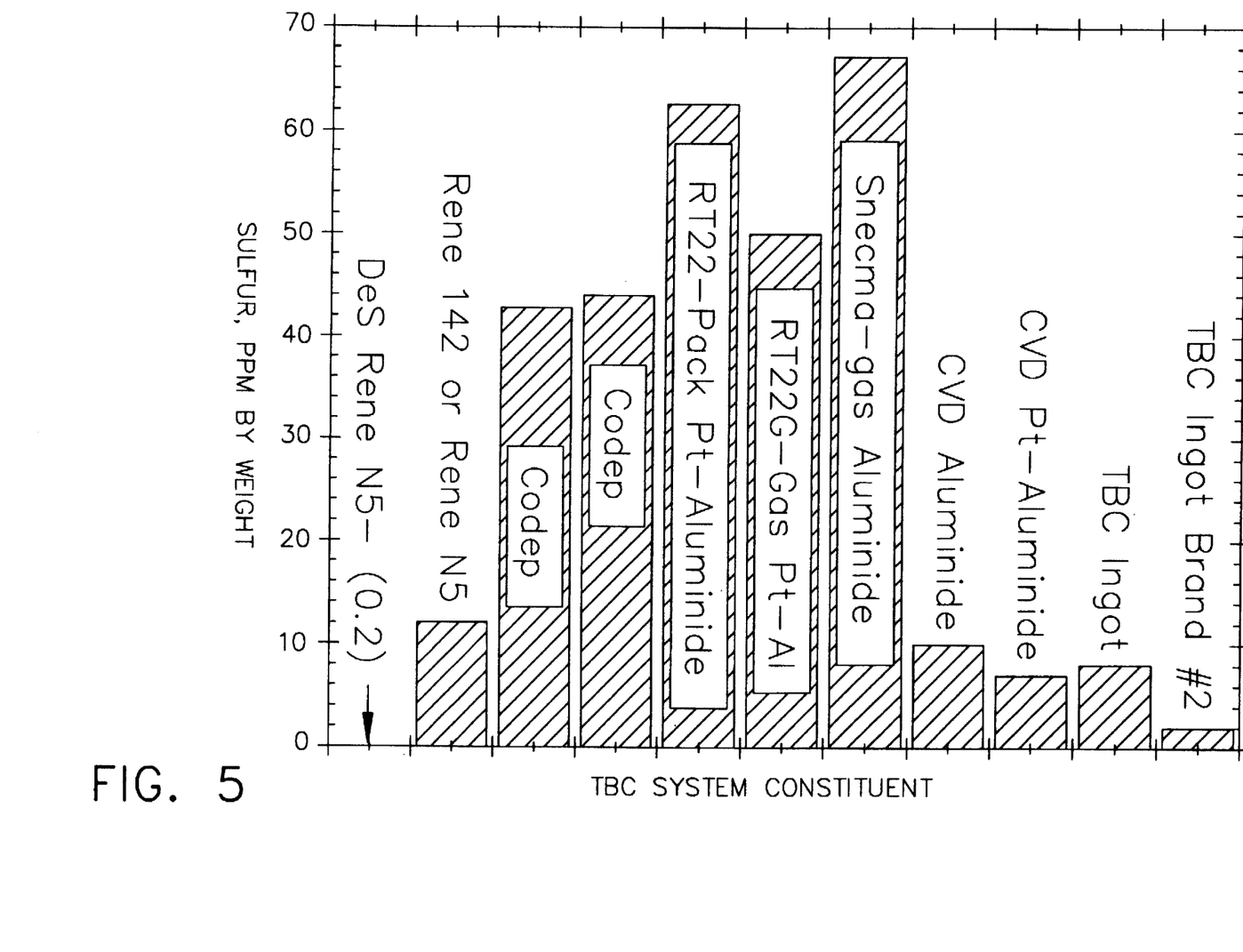
FIG. 5 is a bar graph indicating sulfur content of nickel base superalloy parts after exposure to various commercial processing methods.

Although FIGS. 3 and 4 indicate the sulfur content of blades made by a casting process, as can be seen from FIG. 5, other commercially available processes reintroduce sulfur at unacceptable levels. Such unacceptable levels of sulfur are also introduced into parts which have been machined. Thus, some action must be taken to neutralize or remove sulfur from parts subject to high temperature oxidation if spallation resistance is to be improved. This invention provides a method to remove sulfur from the part surface and near-surface, where sulfur concentrations tend to be highest, in order to improve the adhesion of protective scales and associated improvement in spallation resistance.

Some nickel-base superalloys may contain small amounts of yttrium, zirconium and/or rare earth elements. In such alloys, these elements react with sulfur to form stable sulfides, in which form the sulfur generally does not interfere with the adherence of the protective aluminum oxide layer which overlies the substrate. Inasmuch as such stable sulfides are not reduced by hydrogen and do not affect the adhesion of the ceramic layer, the effectiveness of the method of the present invention is limited to removing "free" sulfur, that is, sulfur which is not tied up in the form of stable sulfides.

Because the sulfur content in nickel-base superalloys can be reduced to a very low level by the method of the present invention, it is no longer necessary to rely on reacting the sulfur with yttrium, zirconium and/or rare earth elements to prevent its adverse effects on scale adherence. This is a highly desirable feature of the present invention, because the presence of such elements complicates the casting operation, raises the cost of the cast product and decreases the available materials useful as substrates since the casting process must be compatible with additions of Y, Zr, Hf and rare earths.

Figure 6:
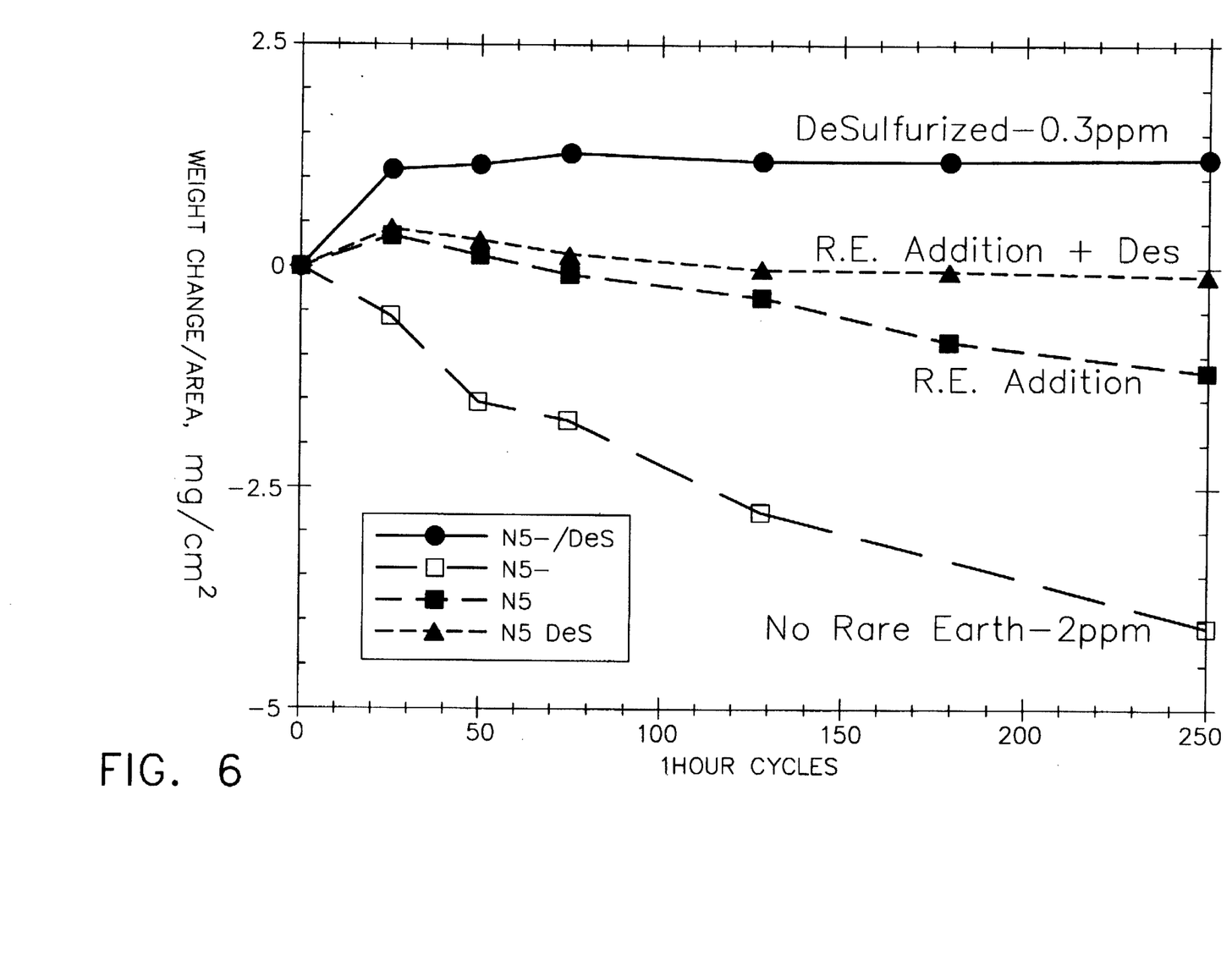
FIG. 6 is a chart of Cyclic Oxidation Testing of an aluminum-bearing nickel base superalloy at 2100° F. (1449° C.), depicting weight change per unit area versus time, for samples treated in accordance with the present invention and untreated samples.

The importance of removing sulfur or combining the sulfur with rare earth elements to form stable oxides can best be appreciated by reference to FIG. 6. FIG. 6 shows the weight change of an aluminum-containing nickel-base superalloy, Rene'NS, in a cyclic oxidation test at 2100° F. (1149° C.). The alloy was not coated, so that the weight change in the tested alloy is attributed to the loss of surface material, such as aluminum oxide, chromium oxide and combinations thereof, from the surface of the tested material. As can be seen from the test results, samples of Rene'N5 having neither rare-earth additions nor desulfurized in accordance with the present invention showed the greatest weight loss, indicative of the instability of the surface material. Conversely, material treated in accordance with the present invention showed a slight weight gain, attributed to the incorporation of oxygen into the oxide layer at the surface, and that the oxide layer is stable. Samples containing rare earth additions also performed acceptably showing little or no weight loss as compared to samples having no rare earth additions or not treated, in accordance with the present invention. Thus, FIG. 6 indicates the importance of removing sulfur to maximize oxidation resistance.

An aluminum oxide scale layer 34, preferably about 0.5–1.5 micrometers (0.00002–0.00006 inches) thick, overlies the substrate 32. The scale layer 34 should not be greater than 1.5 micrometers (0.00006 inches) in thickness, as such thick scales can lead to spallation even in the absence of sulfur. The aluminum oxide scale 34 is thermally grown aluminum oxide formed by the oxidation of aluminum present in the substrate 32, if the substrate is of an aluminum-oxide forming composition. Such thermally grown oxide generally starts as a gamma-aluminum oxide and subsequently transforms to alpha-aluminum oxide. The aluminum oxide scale 34 may optionally be deposited as aluminum oxide, in a non-thermal manner by low sulfur techniques, as by chemical vapor deposition, sputtering, electron beam physical vapor deposition, or other operable technique. Deposition in this manner although acceptable, is not preferred because it adds at least one additional manufacturing step, but may be accomplished when the aluminum oxide cannot be thermally grown or when it is not desired to deplete the substrate of its aluminum content. Such deposited aluminum oxide may be alpha-aluminum oxide rather than the gamma-aluminum oxide produced during early stages of thermal oxidation of aluminum-rich alloys. The aluminum oxide scale 34 may also be formed by depositing an aluminum-rich alloy on the surface of the substrate 32, and then oxidizing the aluminum-rich alloy to produce alpha-aluminum oxide. In cases where the aluminum oxide scale layer 34 is thermally grown, the layer 34 may not be formed until the first time that the component is heated to a sufficiently high temperature. Within the context of the present invention, any desulfurization treatment must precede growing aluminum oxide scale.

A ceramic thermal barrier coating layer 36 is applied overlying the substrate 32 by a physical vapor deposition method and the aluminum oxide scale layer 34 can grow during subsequent thermal treatment. The thermal barrier coating layer 36 is formed of a ceramic material that serves to insulate the substrate 32 from the temperature of the hot exhaust gas passing over the surface of the airfoil portion 22 when the engine is in service. Unexpectedly, the improvement in adhesion of the ceramic thermal barrier coating when applied in accordance with the present invention occurs only when the ceramic thermal barrier coating is applied by a physical vapor deposition method, such as by electron beam deposition or sputtered deposition. The improvements of the present invention do not occur in ceramic thermal barrier coatings applied by other processes such as plasma spraying. Spallation of the ceramic coating still occurs in these plasma sprayed coatings when applied directly to the substrate, even when desulfurized.

Figure 7:
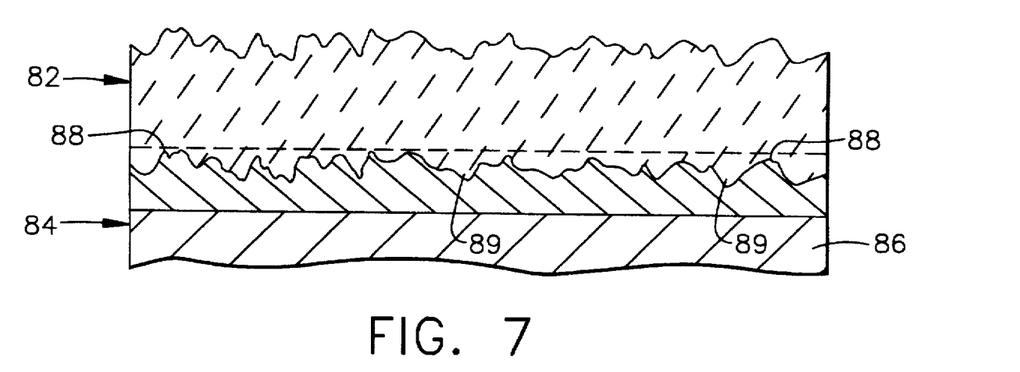
FIG. 7 is a view of a substrate having an optional bond coat to which an air plasma sprayed ceramic layer has been applied.

When ceramic coatings are applied by processes such as air plasma spraying, the coating is attached to the substrate by mechanical bonding. To effectively adhere, the substrate to which the ceramic is attached must have an irregular surface finish such as is provided by a rough surface. As depicted in FIG. 7, an air plasma sprayed ceramic layer 82 is typically applied over a bond coat 84 having the necessary surface roughness. The bond coat 84 in the typical application is applied over the substrate and the necessary roughness is provided by the method of application. However, the bond coat 84 is optional for the purposes of this discussion and the ceramic layer 82 may be sprayed directly over the substrate 86 which may be roughened by any suitable technique. The ceramic layer 82 is bonded to the underlying material by a mechanical bond. In service after repeated thermal cycling, it has been observed that the plasma sprayed ceramic layer tends to begin to spall within the ceramic layer 82, usually initiating in the roughness peak regions 88. However, the ceramic layer 82 in the roughness valley regions 89 is usually unaffected at the onset of spallation. The onset of spallation is independent of substrate desulfuization.

Figure 8:
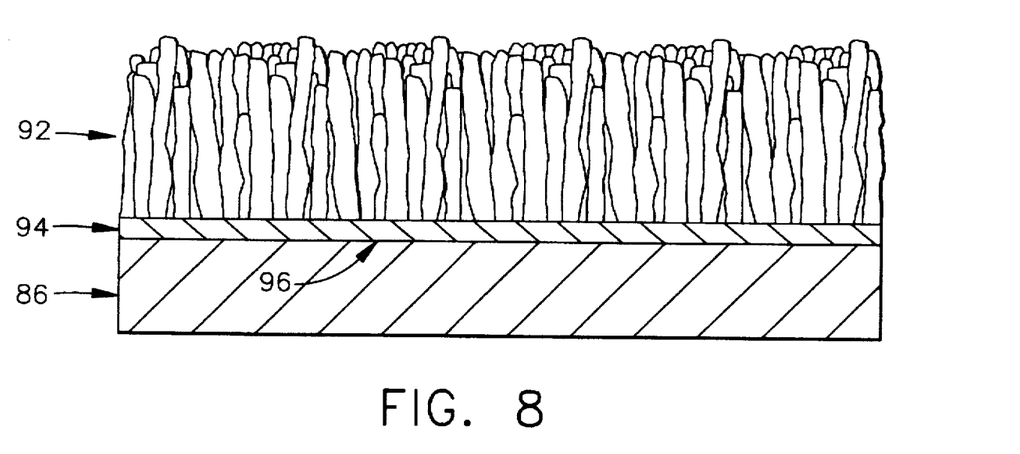
FIG. 8 is a view of a substrate to which a PVD-applied ceramic layer has been applied.

However, when ceramic coatings are applied by physical vapor deposition methods, the ceramic layer has a columnar structure which grows from the surface of the underlying material. Referring to FIG. 8, the ceramic layer 92 has multiple columnar grains and is applied directly to an aluminum-bearing nickel base superalloy substrate surface having an aluminum oxide layer 94 which forms on the superalloy. The columnar grains of the ceramic layer are roughly perpendicular to the surface of the article. The ceramic layer 92 bonds to the aluminum oxide layer 94 by forming an oxide-oxide bond at surface 96. This oxide-oxide bond is strong, causing the adherence of the ceramic layer to the underlying material, and as a chemical bond, is significantly different than the mechanical bond between the ceramic layers applied by processes such as plasma spraying and underlying materials. When an article is coated in accordance with the present invention, the ceramic layer 92 does not spall after repeated cycling, unlike the plasma sprayed ceramic layer 82. Referring now to FIG. 2, the thermal barrier coating layer 36 may be any acceptable material, but desirably is yttria-stabilized zirconia, having a composition of from about 6 to about 20 weight percent yttrium oxide, balance zirconium oxide. The thermal barrier coating layer 40 is typically from about 0.003 to about 0.060 inches (0.08–1.5 mm) thick.

Figure 9:
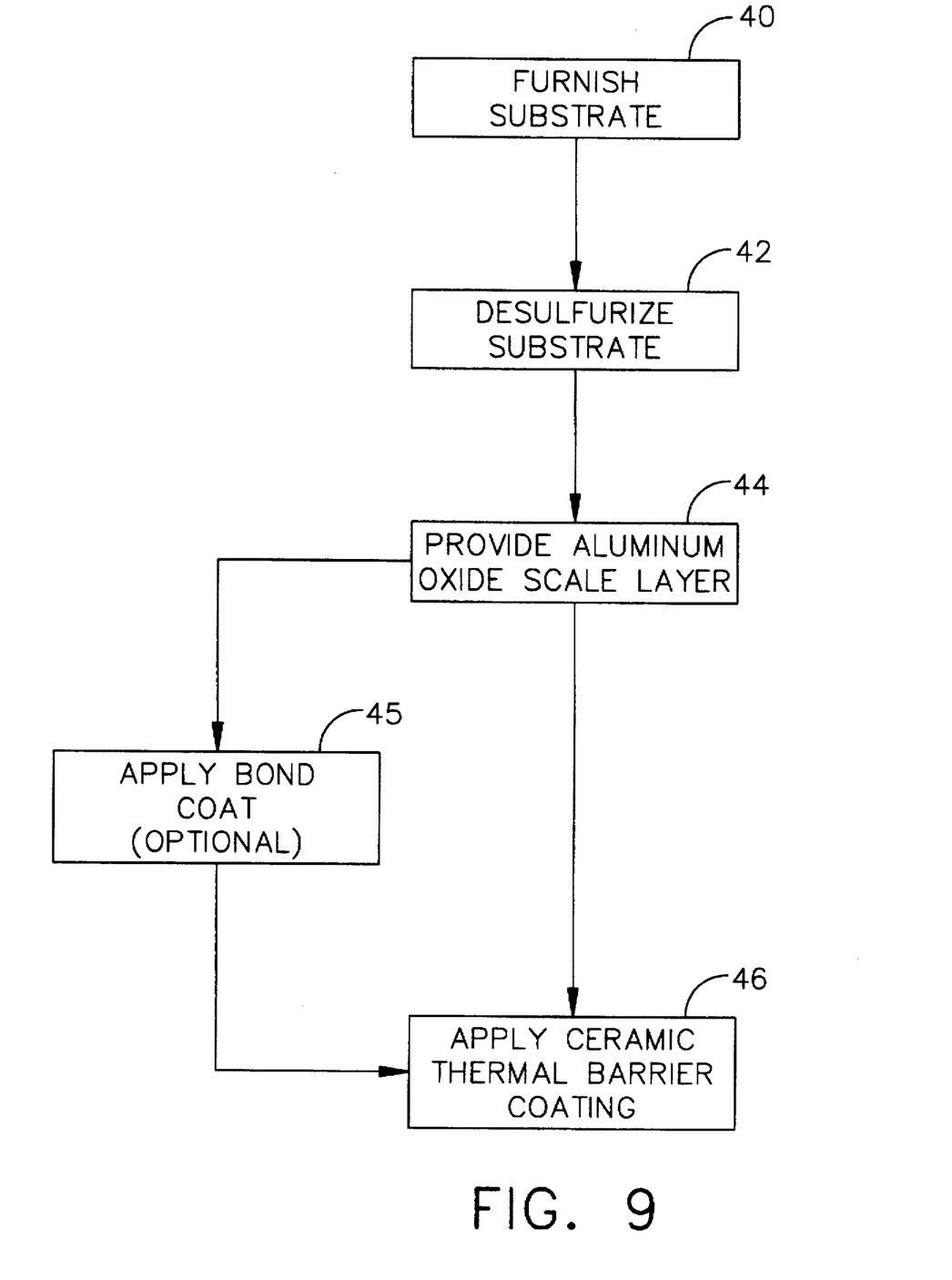
FIG. 9 is a block diagram of one embodiment of the approach of the invention.

FIG. 9 depicts a method for preparing the component of FIG. 1 having the coating of FIG. 2 thereon. The substrate 32 is first furnished, numeral 40. The nickel-base superalloy is ordinarily melted and then cast into a mold. The metal is unidirectionally solidified into an oriented polycrystal, or possibly solidified in such a way as to form a single crystal. Applicable techniques and apparatus are well known in the art. Even though the original alloy may have a relatively low sulfur content, the remelting and directional solidification process typically results in a significantly increased sulfur content of the alloy, as high as 100–8000 ppm. This high sulfur content can have highly adverse effects on the adhesion of the aluminum oxide scale to the substrate, and on the subsequently deposited thermal barrier coating.

The sulfur in the substrate 32 is reduced substantially, to 3 ppm and preferably to 1 ppm or less, and most preferably to 0.1–0.2 ppm, by a desulfurization treatment, numeral 42. Desulfurization is achieved by heating the substrate 32 in a reducing atmosphere, preferably 1 atmosphere of hydrogen, to a high temperature for a period of time sufficient remove the sulfur from the substrate by reacting it with hydrogen to form hydrogen sulfide gas. As indicated above, the depth to which sulfur must be removed is defined functionally. For articles such as gas turbine blades and vanes having internal cooling channels, where the cross sectional thickness of the article may be less than about 0.030 inch (0.76 mm), the functional depth of sulfur removal is preferably through the entire cross sectional thickness. Where the cross sectional thickness of the article is significantly greater, it becomes much more difficult and costly to remove sulfur throughout the entire cross section.

For nickel-base superalloys, the desulfurization heat treatment temperature is at least 2000° F. (about 1100° C.) and preferably is 2200° F. (1204° C.), to achieve the required degree of desulfurization in a commercially acceptable time. The temperature to which the substrate is heated will depend upon the composition of the substrate. For a substrate of Rene'N5, a temperature of about 2340° F. (1282° C.) is preferred. For an actual substrate in the form of a turbine blade airfoil, desulfurization was successfully completed at that temperature in a time of 100 hours.

The desulfurization treatment is conducted after the casting of the superalloy, and just before the deposition of the overlay coatings. It may not be conducted earlier in the process, as for example, prior to the directional solidification, unless some other steps are taken to keep the sulfur content within the required range. Equivalently, any other operable technique may be used in providing the desulfurized substrate, such as a low-sulfur melting and casting technique. The desulfurization treatment may have a significant effect on the metallurgical structure of the substrate, and its effect must be considered in the process of selecting a suitable material for the particular application. For example, the desulfurization treatment might homogenize the cast structure, or cause recrystallization, or dissolve gamma-prime precipitate particles; such effects, which relate to the composition of the substrate alloy, must be considered in selecting the preferred temperature for desulfurization of that alloy.

The aluminum oxide scale layer 34 is provided, numeral 44 of FIG. 7. As discussed previously, the aluminum oxide scale layer may be provided in any operable manner. Such techniques include, for example, thermal oxidation of the substrate 32, deposition of an aluminum-rich layer and oxidation of that layer, CVD or direct non-thermal deposition of the scale layer.

It is noteworthy that no bond coat is required to be deposited. A bond coat is frequently employed to promote adherence of the thermal barrier coating to the substrate, and is not required here. In the present invention, such a bond coat is not required because there is not a sufficiently high sulfur level to cause the aluminum oxide layer and overlying thermal barrier coating to debond from the substrate. Good bonding is retained because there is no operable mechanism to interfere with the adherence.

Substrates prepared in accordance with the present invention remarkably are resistant to spallation of a ceramic top coat applied directly to the substrate surface. Three panels made from a nickel base superalloy and having dimensions of 0.5"×0.8"×0.016" were prepared. Each panel had a ceramic top coat off yttria-stabilized zirconia (8%) applied to one side. Two of the panels, 60-1 and 60-2, were not desulfurized in accordance with the present invention, while the third panel, 60-3, was hydrogen annealed in accordance with the present invention for five hours. The sulfur content of panel 60-2 was not measured. However, the sulfur content of panel 60-1 was measured at 10 ppm. The sulfur content of panel 60-3 was measured at 0.1–0.2 ppm. The parts were then tested by cycling to an elevated temperature and back to ambient. The test results are set forth in Table I. The panels not desulfurized in accordance with the present invention exhibited 100% spallation after 120 thermal cycles at 2000° F. (1094° C.). However, the desulfurized panel displayed no spallation after 160 cycles at 2000° F. (1094° C.). This panel exhibited no spallation until subjected to an increased temperature, 2075° F. (1135° C.), and an additional 260 thermal cycles, at which point it failed. Thus, substrates having ceramic top coats directly applied and treated in accordance with the present invention show increased resistance to spallation than do similar substrates not treated in accordance with the present invention.

TABLE I

| | | Thermal Cycle Testing | | |
|---|---|---|---|---|
| # of Thermal Cycles | Temp. (°F.) | 60-1 S Content 10 ppm Spallation 60-1 | 60-2 S Content — Spallation 60-2 | 60-3 S Content .1–.2 ppm Spallation 60-3 |
| 20 | 1925 | 2% | 0 | 0 |
| 40 | 1925 | 2% | 0 | 0 |
| 20 | 2000 | 2% | 0 | 0 |
| 60 | 2000 | 2% | 0 | 0 |
| 80 | 2000 | 2% | 0 | 0 |
| 100 | 2000 | 2% | 0 | 0 |
| 120 | 2000 | 100%* | 100%* | 0 |
| 140 | 2000 | | | 0 |
| 160 | 2000 | | | 0 |
| 20 | 2075 | | | 0 |
| 40 | 2075 | | | 0 |
| 60 | 2075 | | | 6% |
| 260 | 2075 | | | 100%* |

*Testing Discontinued

This, sulfur removal is important in obtaining a spall-resistant thermal barrier coating system comprised of an aluminum-containing substrate overlaid directly with a ceramic top coat. Analysis indicates that unacceptable sulfur is present in commercially available alloys or is added by conventional processing. FIG. 5 provides a comparison of the sulfur content of an aluminum-containing nickel base superalloy desulfurized in accordance with the present invention, the sulfur content of commercially available alloys and the sulfur content of commercially available aluminum-containing nickel base superalloys after being subjected to conventional coating processes. As can be seen, the sulfur content of commercially-available aluminum-containing superalloys and aluminum-containing superalloys subjected to most coating processes is unacceptably high, so that a ceramic top coat could not effectively be applied directly to them.

The thermal barrier coating 36 is deposited over the substrate 32 and oxide scale layer 34, numeral 46 of FIG. 7. The thermal barrier coating may be deposited by any operable low sulfur technique, with air plasma spray, electron beam physical vapor deposition or low pressure plasma spray preferred. The thermal barrier coating system 30 is now complete.

Once the sulfur has-been removed from the substrate, and the adhesion of the protective $Al_2O_3$ and $Cr_2O_3$ scales to the substrate has been improved, the cyclic oxidation resistance of the substrate, either without additional ceramic top coats and with ceramic top coats is significantly improved. This improvement in adhesion and resulting improved cyclic oxidation resistance appears to be substantially independent of the environment in which the substrate is subsequently place. Desulfurized pins having a diameter of 0.125 inches (0.318 cm) were placed in an environment high in free sulfur, such as would be expected of an airfoil in a gas turbine exposed to fuel and sea water. Specifically, desulfurized samples treated in accordance with the present invention and untreated samples of two aluminum-containing nickel base superalloys, Rene' N5 containing yttrium and Rene'142 were corrosion tested at 1700° F. (927° C.) in an atmosphere containing 5 ppm sea salt and 0.2% sulfur. After 192 hours, the untreated sample of Rene'142 were swollen and blistered. The pins could readily be snapped in half as little uncorroded metal remained. Scanning electron micrography (SEM) revealed unprotective scales of (Ni,Co)O and cracks extending to the pin centerline. The Rene'142 pin desulfurized in accordance with the present invention showed only some distress at the tip, and was otherwise unaffected. SEM disclosed the presence of $Al_2O_3$ scales with no cracking. There was little or no difference in the behavior of the treated and untreated pins of Rene'N5 containing yttrium, indicating that the present invention does not substantially improve the adhesion of the protective oxide scales of this alloy when it contains yttrium or other rare earth additions. This testing indicates that the rare earth additions may in fact be providing the same benefit with respect to sulfur that the hydrogen anneal of the present invention accomplishes.

This invention has been described in connection with specific embodiments and examples. However, it will be readily recognized by those skilled in the art the various modifications and variations of which the present invention is capable without departing from its scope as represented by the appended claims.

What is claimed is:

1. A method for preparing a coated article, comprising the steps of:

furnishing an aluminum-bearing nickel base superalloy article substrate; thereafter desulfurizing the article substrate; and applying by a physical vapor deposition process a ceramic thermal barrier coating overlying the substrate, there being no bond coat applied to the substrate prior to the application of the thermal barrier coating.

2. The method of claim 1, wherein the step of furnishing includes the steps of melting and casting an alloy that forms the article substrate.

3. The method of claim 1, wherein the step of desulfurizing includes the step of heating the article substrate to an elevated temperature in the presence of a gaseous reactive agent that reacts with sulfur to form a gaseous sulfide.

4. The method of claim 3, wherein the step of heating includes heating the substrate to a temperature of at least 2000° F.

5. The method of claim 3, wherein the gaseous reactive agent comprises hydrogen.

6. The method of claim 1, wherein the step of applying the thermal barrier coating by a physical vapor deposition process is selected from the group of physical vapor deposition processes consisting of electron beam deposition and sputtering.

7. The method of claim 6, wherein the thermal barrier coating is yttria-stabilized zirconia.

8. The method of claim 1, including the additional step, after the step of desulfurizing and before the step of applying a thermal barrier coating, of providing an aluminum-oxide environmental coating overlying the substrate.

9. An article prepared by the process of claim 1.

10. A method for preparing a coated article, comprising the steps of:

furnishing an article substrate formed of a nickel-base superalloy; thereafter heating the article substrate in a gaseous reactive agent for a period sufficient to desulfurize the substrate; and applying a ceramic thermal barrier coating by a physical vapor deposition process overlying the substrate, there being no bond coat applied to the substrate prior to the application of the thermal barrier coating.

11. The method of claim 10, wherein the reactive agent comprises hydrogen.

12. The method of claim 10, wherein the step of heating heats the article to a temperature of at least 2000° F.

13. The method of claim 10, wherein the step of providing includes the step of overcoating at least a portion of the surface of the article with an environmental coating that forms an aluminum-oxide scale upon heating.

14. The method of claim 10, wherein the step of providing includes the step of depositing an aluminum-oxide scale on the surface of the article.

15. The method of claim 10, wherein the step of applying the thermal barrier coating by a physical vapor deposition process is selected from the group of physical vapor deposition processes consisting of electron beam deposition and sputtering.

16. An article prepared by the process of claim 10.

17. The method of claim 10 further including a step of providing an aluminum oxide environmental coating overlying the substrate.

18. The method of claim 17 wherein the aluminum oxide environmental coating is thermally grown onto the substrate.

19. The method of claim 17 wherein the ceramic thermal barrier coating overlies the environmental coating.

20. A method for preparing a coated article, comprising the steps of:

furnishing an article substrate formed of a nickel-base superalloy, the superalloy having a sulfur content of less than about 1 part per million by weight; and applying, using a low sulfur application method, a ceramic thermal barrier coating overlying the substrate, there being no bond coat applied to the substrate prior to the application of the thermal barrier coating.

21. The method of claim 20, including the additional step, after the step of furnishing and before the step of applying, of providing at least a portion of the surface of the article with an environmental coating that forms an aluminum-oxide scale upon heating.

22. The method of claim 21, wherein the step of providing includes the step of depositing an aluminum-oxide scale on the surface of the article.

23. The method of claim 21, wherein the step of providing includes the step of depositing an aluminum-rich overcoating onto the surface of the substrate.

24. An article prepared by the process of claim 20.

\* \* \* \* \*

UNITED STATES PATENT AND TRADEMARK OFFICE
CERTIFICATE OF CORRECTION

PATENT NO. : 5,538,796

DATED : JULY 23, 1996

INVENTOR(S) : JON C. SCHAEFFER, ET AL.

It is certified that error appears in the above-identified patent and that said Letters Patent is hereby corrected as shown below:

On the title page, item [75],
Please delete "Jon C. Schaffer" and insert therefor -- Jon C. Schaeffer --.

Signed and Sealed this

Thirteenth Day of May, 1997

*Attest:*

BRUCE LEHMAN

*Attesting Officer*     *Commissioner of Patents and Trademarks*